US006590279B1

United States Patent
Huang et al.

(10) Patent No.: US 6,590,279 B1
(45) Date of Patent: Jul. 8, 2003

(54) DUAL-CHIP INTEGRATED CIRCUIT PACKAGE AND METHOD OF MANUFACTURING THE SAME

(75) Inventors: Chieh-Ping Huang, Hsinchu Hsien (TW); Lian-Cherng Chiang, Taichung (TW); Wen-Ta Tsai, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/470,515

(22) Filed: Dec. 22, 1999

(30) Foreign Application Priority Data

Apr. 28, 1999 (TW) .......................... 88106798 A

(51) Int. Cl.⁷ .................. H01L 23/02; H01L 23/495
(52) U.S. Cl. .................. 257/676; 257/666; 257/670; 257/690; 257/678; 257/777; 257/686; 257/787; 257/784
(58) Field of Search ................ 257/666, 670, 257/676, 690–692, 684, 784, 777, 723, 686, 787

(56) References Cited

U.S. PATENT DOCUMENTS

| | | | | |
|---|---|---|---|---|
| 5,233,222 A | * | 8/1993 | Djennas et al. ............. | 257/676 |
| 5,521,428 A | * | 5/1996 | Hollingsworth et al. .... | 257/670 |
| 5,661,338 A | * | 8/1997 | Yoo et al. .................... | 257/676 |
| 5,793,108 A | | 8/1998 | Nakanishi et al. | |
| 6,040,621 A | * | 3/2000 | Nose .......................... | 257/666 |
| 6,087,715 A | * | 7/2000 | Sawada et al. ............. | 257/666 |
| 6,476,474 B1 | * | 11/2002 | Hung ......................... | 257/686 |

FOREIGN PATENT DOCUMENTS

| | | | | |
|---|---|---|---|---|
| JP | 406029448 | * | 2/1994 | ................ 23/50 |
| JP | 406104375 | * | 4/1994 | ................ 23/50 |

* cited by examiner

Primary Examiner—Tom Thomas
Assistant Examiner—Nitin Parekh
(74) Attorney, Agent, or Firm—Peter F. Corless; Steven M. Jensen; Edwards & Angell, LLP

(57) ABSTRACT

A dual-chip integrated circuit package and a method for manufacturing such a dual-chip integrated circuit package are proposed, which can help prevent the occurrence of cracking and delamination in the chips and the occurrence of voids in the encapsulant during the manufacture process. The dual-chip integrated circuit package is constructed on a leadframe having a plurality of first leads and a plurality of second leads and at least a pair of support members between the first and second leads. Further, the dual-chip integrated circuit package includes at least one support member attached to the front side of the first integrated circuit chip for providing a support to the bonding pads on the second integrated circuit chip; the support member being not smaller in dimension than the area where the bonding pads on the second integrated circuit chip are located. An encapsulant is used for encapsulating the first integrated circuit chip, the second integrated circuit chip, the support members, and inner parts of the first and second leads of the leadframe. Since the support members can provide good support to the bonding pads on the second integrated circuit chip, it can help prevent the chips from being cracked during the manufacture process. The manufactured dual-chip integrated circuit package can be thus reliable in quality.

10 Claims, 7 Drawing Sheets

DUAL-CHIP INTEGRATED CIRCUIT PACKAGE AND METHOD OF MANUFACTURING THE SAME

BACKGROUND OF THE INVENTION

1. Field of the Invention

This invention relates to integrated circuit (IC) packages, and more particularly, to a dual-chip integrated circuit package and a method for manufacturing such a dual-chip integrated circuit package.

2. Description of Related Art

An integrated circuit package is typically formed with a single semiconductor chip. To allow increased functionality and density of electronic components from a single integrated circuit package, it is usually desired and a tendency to pack two or more semiconductor chips rather than just one in an integrated circuit package. An integrated circuit package that packs two integrated circuit chips therein is customarily referred to as a dual-chip integrated circuit package.

The U.S. Pat. No. 5,793,108 discloses a dual-chip integrated circuit package. FIG. 8 is a schematic sectional diagram showing the structure of this dual-chip integrated circuit package. As shown, this dual-chip integrated circuit package includes a leadframe 100 having a die pad 101 for mounting a first integrated circuit chip 120 and a second integrated circuit chip 140. The first integrated circuit chip 120 has its front side 121 attached to the die pad 101 by means of an insulative film 110. The bonding pads 123 on the first integrated circuit chip 120 are electrically connected via a plurality of gold wires 150 to the first surface 102a of the leads 102 of the leadframe 100. An insulative adhesive layer 130 is then coated on the back side 122 of the first integrated circuit chip 120 for attaching the first integrated circuit chip 120 to the back side 142 of the second integrated circuit chip 140. The bonding pads 143 on the front side 141 of the second integrated circuit chip 140 are electrically connected via a plurality of gold wires 160 to a second surface 102b of the leads 102. Further, an encapsulant 170 is formed to encapsulate the first integrated circuit chip 120, the second integrated circuit chip 140, and the inner part of the leads 102. Active circuitry is formed on the front side 121 of the first integrated circuit chip 120 and the front side 141 of the second integrated circuit chip 140.

The forgoing dual-chip integrated circuit package, however, has the following drawbacks. First, it requires the bonding pads 123 on the front side 121 of the first integrated circuit chip 120 to be exposed out of the die pad 101 so as to facilitate the connection of the bonding pads 123 with the gold wires 150. This requires the jointed area between the first integrated circuit chip 120 and the die pad 101 to be smaller than the area of the front side 121 of the first integrated circuit chip 120. However, after the second integrated circuit chip 140 has been attached to the first integrated circuit chip 120, the beneath of the bonding pads 143 on the second integrated circuit chip 140 is a void space without support from the die pad 101. As a consequence, as shown in FIG. 9, during the wire bonding process to connect the bonding wires 160, the second integrated circuit chip 140 is only partly supported by the fixture 180 positioned underneath the die pad 101, which would easily cause the areas near the bonding pads 143 on the second integrated circuit chip 140 and the bonding pads 123 on the first integrated circuit chip 120 to be cracked. Second, since the front side 121 of the first integrated circuit chip 120 is attached to the die pad 101 in a direct face-to-face manner, the first integrated circuit chip 120 could easily subjected to delamination during any temperature change in the manufacture process. This is because that the first integrated circuit chip 120 differs in coefficient of thermal expansion from the die pad 101. The direct face-to-face attachment also requires the insulative film 110 to be large enough to cover the whole of the die pad 101. This practice, however, would considerably increase the manufacture cost. Moreover, the insulative film 110 being made large would hamper the drainage of the air between the insulative tape 110 and the die pad 101 and the air between the insulative tape 110 and the first integrated circuit chip 120, which would undesirably cause voids to be formed in these parts. Under a subsequent high-temperature process condition, the existence of such voids would cause a popcorn effect, which could damage the integrated circuit package structure. Still one drawback is that when the foregoing dual-chip integrated circuit package is made into a low profile device, the gap between the bottom side of the die pad 101 and the bottom of a cavity of an encapsulation mold (not shown) would become very small, causing the flow of the melted molding compound to be slowed down, resulting in the undesired forming of voids in the formed encapsulant. The forming of these voids could also lead to the problem of a popcorn effect.

SUMMARY OF THE INVENTION

It is therefore an objective of this invention to provide a dual-chip integrated circuit package, which can help prevent the chips from being cracked during the manufacture process.

It is another objective of this invention to provide a dual-chip integrated circuit package, which can help prevent delamination from occurrence during the manufacture process.

It is still another objective of this invention to provide a dual-chip integrated circuit package, which can help prevent the occurrence of voids in the encapsulant.

In accordance with the foregoing and other objectives, the invention proposes a new dual-chip integrated circuit package and a method for manufacturing such a dual-chip integrated circuit package.

The dual-chip integrated circuit package of the invention includes: (a) a first integrated circuit chip having a front side and a back side, with the front side being formed with a plurality of bonding pads; (b) a second integrated circuit chip having a front side and a back side, with the front side being formed a plurality of bonding pads; the second integrated circuit chip being attached to the first integrated circuit chip in a back-to-back manner; (c) a leadframe having a plurality of first leads and a plurality of second leads and at least a pair of support members between the first and second leads; at least one support member attached to the front side of the first integrated circuit chip being for providing a support to the bonding pads on the second integrated circuit chip; the support member being not smaller in dimension than the area where the bonding pads on the second integrated circuit chip are located; (d) a plurality of bonding wires for connecting the bonding pads on the first integrated circuit chip to the first leads and the bonding pads on the second integrated circuit chip to the second leads; (e) at least one insulative adhesive for attaching the support member to the front side of the first integrated circuit chip; and (f) an encapsulant for encapsulating the first integrated circuit chip, the second integrated circuit chip, the support members, and inner parts of the first and second leads of the leadframe.

The method according to the invention for manufacturing the foregoing dual-chip integrated circuit package includes the following steps: (1) preparing a leadframe having a plurality of first leads and a plurality of second leads and at least a pair of support members between the first and second leads; (2) mounting a first integrated circuit chip onto the support members of the leadframe, the first integrated circuit chip having a front side and a back side, with the front side being formed with a plurality of bonding pads; the first integrated circuit chip being mounted onto the support members in such a manner that the front side thereof faces the support members and the bonding pads on the first integrated circuit chip are separated from any of the support members; (3) performing a first wire-bonding process to connect a plurality of bonding wires between the bonding pads on the first integrated circuit chip and the first leads of the leadframe; (4) mounting a second integrated circuit chip in a back-to-back manner to the first integrated circuit chip; the second integrated circuit chip having a front side and a back side, with the front side thereof being formed with a plurality of bonding pads; the second integrated circuit chip being mounted onto the first integrated circuit chip in such a manner that the back side of the second integrated circuit chip is attached to the back side of the first integrated circuit chip and the bonding pads on the second integrated circuit chip are aligned to at least one of the support members; (5) performing a second wire-bonding process to connect a plurality of bonding wires between the bonding pads on the second integrated circuit chip and the second leads of the leadframe; and (6) performing an encapsulation process to form an encapsulant for encapsulating the first integrated circuit chip, the second integrated circuit chip, the support members, and inner parts of the first and second leads of the leadframe.

By the invention, only a minor portion of the front side of the first integrated circuit chip comes in touch with the support members; and therefore, it can help prevent delamination from occurring between the first integrated circuit chip and the support members. Moreover, since the total area of the support members is far less than the surface area of the first integrated circuit chip, the insulative films can be very small in size, allowing the utilization of the insulative films in the dual-chip integrated circuit package of the invention to be very cost-effective. In addition, the use of the insulative films to attach the first integrated circuit chip to the support members can help prevent the forming of voids between the insulative films and the first integrated circuit chip and also between the insulative films and the support members. The popcorn effect can thus be prevented.

In the case of the two integrated circuit chips being flash memory chips, each chip is formed with only one row of bonding pads. In this case, it only requires the use of one of the support members attached to the first integrated circuit chip to support the single row of bonding pads on the second integrated circuit chip.

In the case of the first integrated circuit chip being a flash memory chip while the second integrated circuit chip being an ASIC chip, the first integrated circuit chip is formed with only one row of bonding pads while the second integrated circuit chip is formed with two rows of bonding pads. In this case, it requires the use of two support members attached to the first integrated circuit chip to respectively support the two rows of bonding pads on the second integrated circuit chip. Moreover, the second integrated circuit chip should be smaller in dimension than the first integrated circuit chip in the direction extending from the first leads to the second leads of the leadframe, so that the support members can be positioned at a distance away from the bonding pads on the first integrated circuit chip.

In the case of the two integrated circuit chips being ASIC chips, each chip is formed with two rows of bonding pads. In this case, it requires the use of two support members attached to the first integrated circuit chip to respectively support the two rows of bonding pads on the second integrated circuit chip. Moreover, the second integrated circuit chip should be smaller in dimension than the first integrated circuit chip in the direction extending from the first leads to the second leads of the leadframe, so that the support members can be positioned at a distance away from the bonding pads on the first integrated circuit chip and, at the same time, the bonding pads on the second integrated circuit chip can be appropriately supported by the support members.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
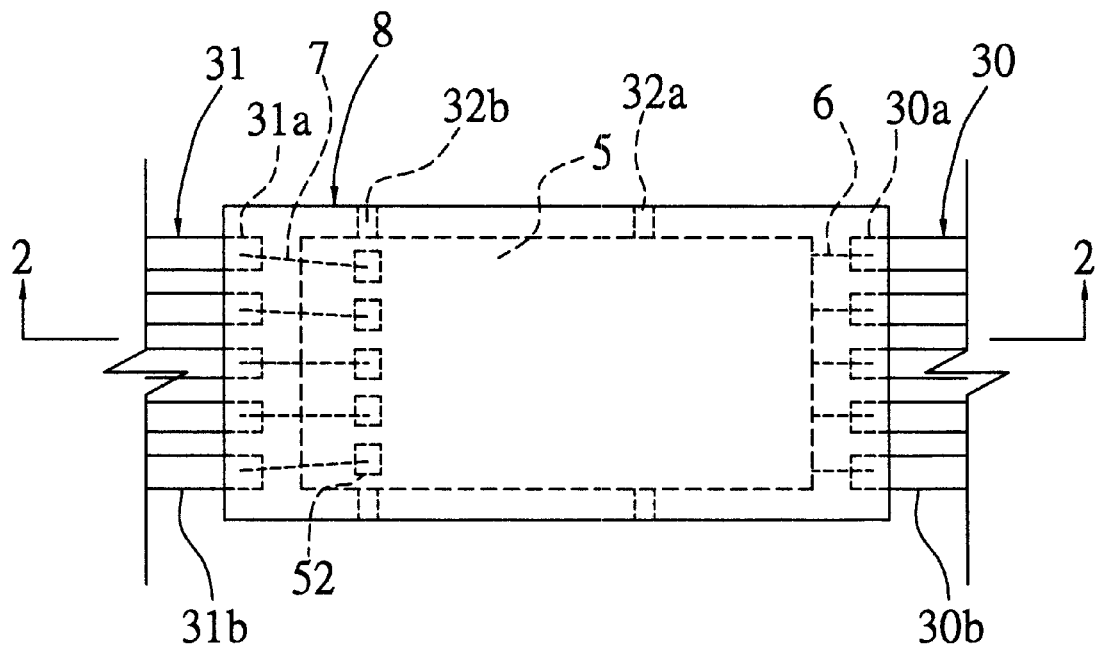
FIG. 1 shows a schematic top view of a first preferred embodiment of the dual-chip integrated circuit package according to the invention.

In accordance with the invention, four preferred embodiments are disclosed in full details in the following.

First Preferred Embodiment

The first preferred embodiment of the dual-chip integrated circuit package of the invention is disclosed in the following with reference to FIGS. 1–2.

As shown, the dual-chip integrated circuit package of the invention is designed to pack two integrated circuit chips, including a first integrated circuit chip 4 and a second integrated circuit chip 5. The dual-chip integrated circuit package is constructed on a leadframe 3 which is formed with a plurality of first leads 30, a plurality of second leads 31, and a pair of support members 32a, 32b. The first integrated circuit chip 4 is electrically connected via a plurality of first gold wires 6 to the first leads 30, while the second integrated circuit chip 5 is connected via a plurality of second gold wires 7 to the second leads 31. Further, the dual-chip integrated circuit package is encapsulated in an encapsulant 8.

Figure 2:
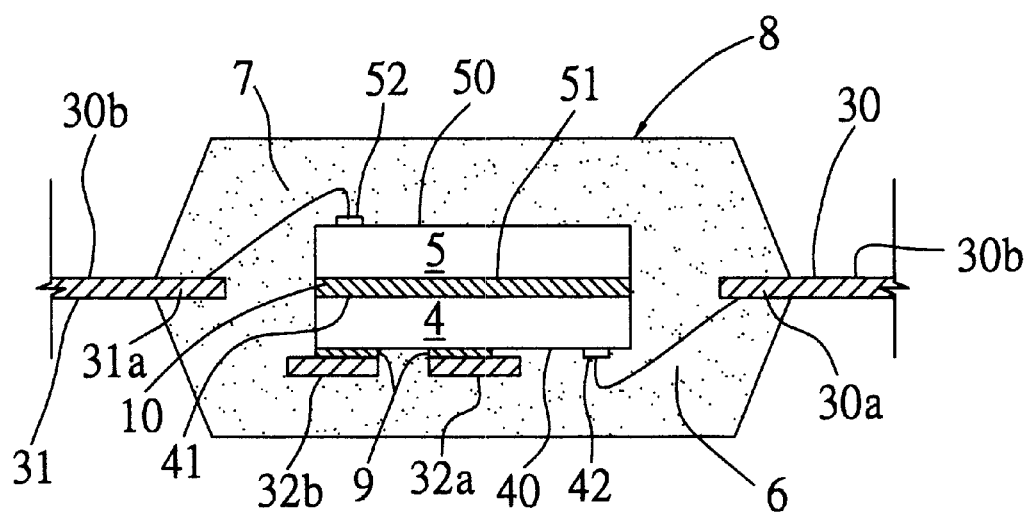
FIG. 2 is a schematic sectional diagram of the dual-chip integrated circuit package of FIG. 1 cutting through the line 2—2.

As shown in FIG. 2, the first integrated circuit chip 4 has a front side 40 and a back side 41; and the second integrated circuit chip 5 has a front side 50 and a back side 51 (the front side is where the active circuitry and electronic components of the integrated circuit chip is formed). The two integrated circuit chips 4, 5 are mounted in a back-to-back manner, with the back side 41 of the first integrated circuit chip 4 being glued to the back side 51 of the second integrated circuit chip 5 by means of an adhesive layer 10. The front side 40 of the first integrated circuit chip 4 is provided with a plurality of bonding pads 42 which are connected via the first gold wires 6 to the first leads 30; and similarly, the front face 50 of the second integrated circuit chip 5 is provided with a plurality of bonding pads 52 which are connected via the second gold wires 7 to the second leads 31. The bonding pads 42, 52 are made of a conductive material, such as aluminum. Further, the front side 40 of the first integrated circuit chip 4 is attached to the support members 32a, 32b respectively by means of two insulative films 9, which are preferably formed from a resin material, such as polyimide. The insulative films 9 serve as a buffer to the first integrated circuit chip 4, allowing the first integrated circuit chip 4 to be prevented from being crashed by the pressure from the second integrated circuit chip 5 when mounting the second integrated circuit chip 5 to the back side 41 of the first integrated circuit chip 4.

Since only a small portion of the front side 40 of the first integrated circuit chip 4 comes in touch with the support members 32a, 32b, it can help prevent delamination from taking place between the first integrated circuit chip 4 and the support members 32a, 32b. Moreover, since the total area of the two support members 32a, 32b is far less than the surface area of the first integrated circuit chip 4, the insulative films 9 can be very small in size, allowing the utilization of the insulative films 9 in the dual-chip integrated circuit package of the invention to be very cost-effective. In addition, the use of the insulative films 9 to attach the first integrated circuit chip 4 to the support members 32a, 32b can help prevent the forming of voids between the insulative films 9 and the first integrated circuit chip 4 and also between the insulative films 9 and the support members 32a, 32b.

Figure 3:
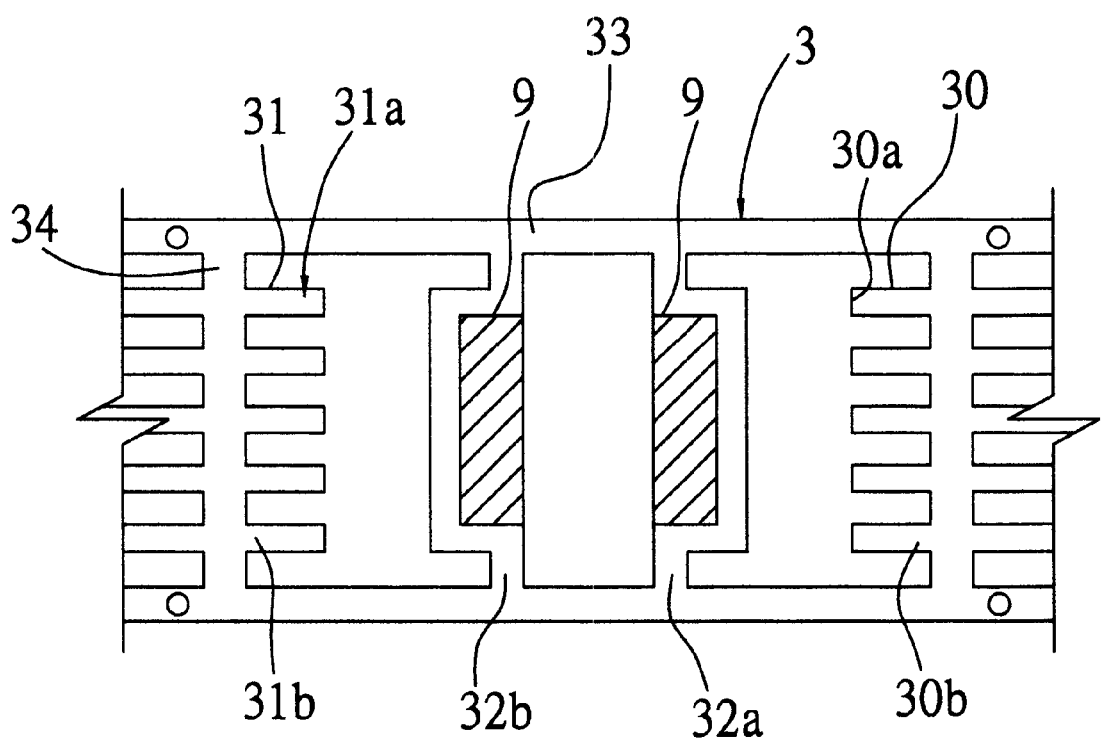
FIG. 3 shows a schematic top view of a leadframe utilized in the dual-chip integrated circuit package of FIG. 1.

FIG. 3 shows a schematic top view of the leadframe 3 utilized in the dual-chip integrated circuit package of FIG. 1. As shown, the leadframe 3 is formed with a plurality of first leads 30 and second leads 31. The first leads 30 is each defined into an inner part 30a which is to be enclosed in the encapsulant 8 and an outer part 30b which is to be exposed to the outside of the encapsulant 8; and similarly, the second lead 31 is each defined into an inner part 31a and an outer part 31b with the same purpose. The support members 32a, 32b are attached to the framing part 33 of the leadframe 3. The framing part 33 of the leadframe 3 will be cut away after the encapsulation process is completed. When the first integrated circuit chip 4 is mounted in position, it can be held firmly by the support members 32a, 32b. In the mounting of the second integrated circuit chip 5, it is required to align the bonding pads 52 vertically with the second support member 32b so that the bonding pads 52 can be supported by the first integrated circuit chip 4 and the second support member 32b. This can help prevent any of the two integrated circuit chips 4, 5 from being cracked during the process for bonding the second gold wires 7 onto the bonding pads 52. To allow an increased supporting strength to the bonding pads 52, the second support member 32b can be increased in dimension. Further, the support members 32a, 32b are separated from each other by a gap which allows the encapsulation material used in the encapsulation process to flow therethrough, allowing the part beneath the front side 40 of the first integrated circuit chip 4 to be completely filled by the encapsulation material without the forming of voids therein.

FIGS. 4A–4G are schematic sectional diagrams used to depict the steps involved in the process for manufacturing the foregoing dual-chip integrated circuit package.

Figure 4A:
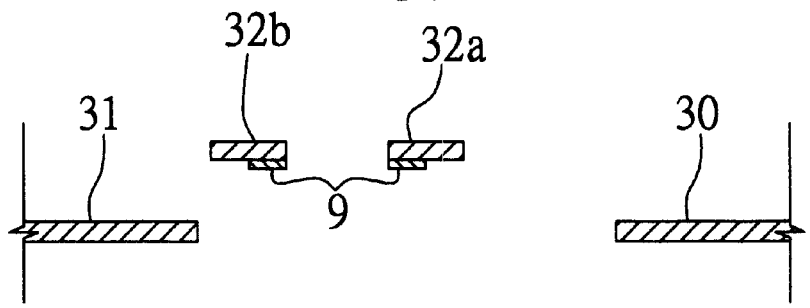
FIGS. 4A–4G are schematic sectional diagrams used to depict the steps involved in the process for manufacturing the dual-chip integrated circuit package of FIG. 1.

Referring first to FIG. 4A, in the first step, a pair of insulative films 9 are attached respectively to the support members 32a, 32b. The insulative films 9 can be made small in size without having to cover the entire bottom surface of the respective support members 32a, 32b.

Figure 4B:
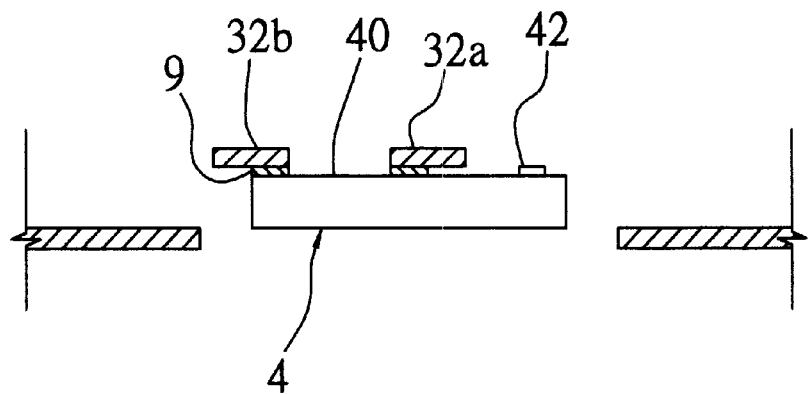

Referring next to FIG. 4B, in the next step, a first integrated circuit chip 4 is mounted in such a manner that its front side 40 is attached to the insulative films 9. This allows the first integrated circuit chip 4 to be mounted on the support members 32a, 32b by means of the insulative films 9. The first integrated circuit chip 4 should be positioned in such a manner that the subsequently mounted second integrated circuit chip 5 can have its bonding pads 52 vertically aligned to the second support member 32b so as to allow the bonding pads 52 to be adequately supported during the wire-bonding process for the bonding pads 52. This can help prevent any of the two integrated circuit chips 4, 5 from being cracked. Further, the first support member 32a is positioned in such a manner as to allow the bonding pads 42 on the first integrated circuit chip 4 to be uncovered thereby, so that the wire-bonding process for the bonding pads 42 can be carried out without being impeded by the first support member 32a.

Figure 4C:
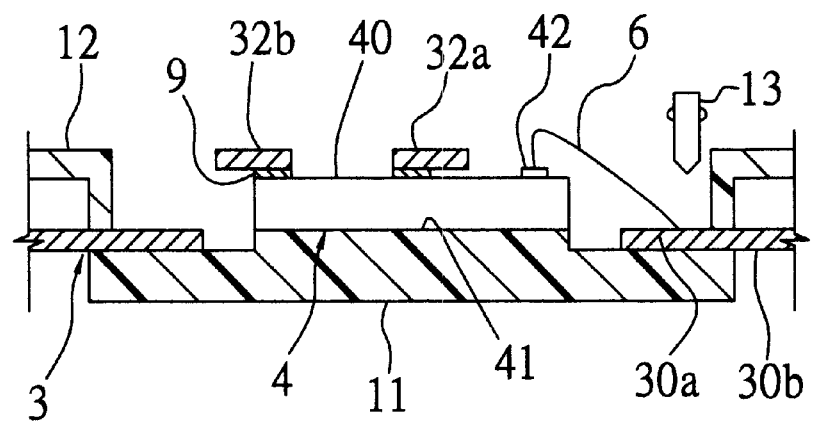

Referring further to FIG. 4C, in the next step, the leadframe 3 is securely placed on a heat block 11 by grasping the first leads 30 by a fixture 12. With this, a wire-bonding machine 13 is used to perform a wire-bonding process, which connects a plurality of first gold wires 6 between the bonding pads 42 on the front side 40 of the first integrated circuit chip 4 and the inner parts 30a of the first leads 30. During this process, since the first integrated circuit chip 4 is placed in such a manner that its front side 40 faces up while the back side 41 faces down against the heat block 11, the circuitry and electronic components on the front side 40 can be prevented from being damaged or contaminated by the heat block 11.

Figure 4D:
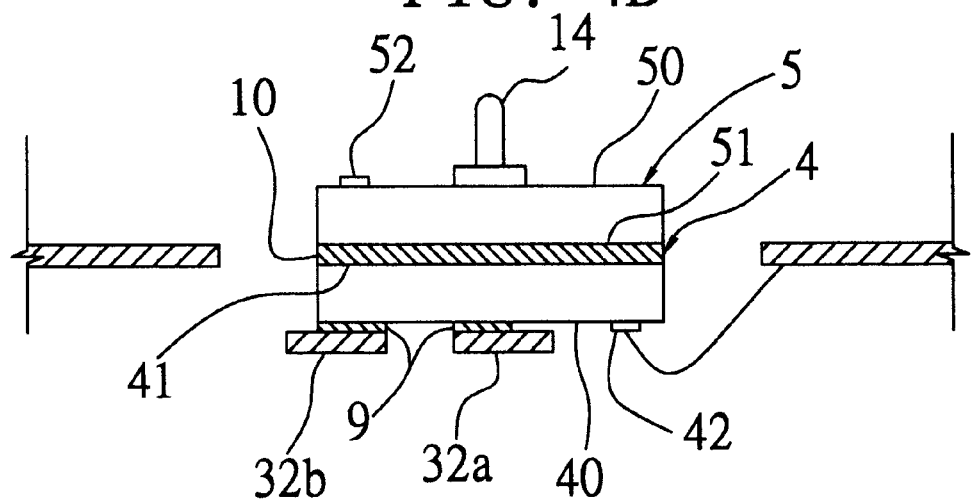

Referring further to FIG. 4D, in the next step, the leadframe 3 is turned upside down, which causes the back side 41 of the first integrated circuit chip 4 to face up. Then, an adhesive layer 10 is coated on the back side 41 of the first integrated circuit chip 4; and next, a second integrated circuit chip 5, whose front face 50 is grasped by a collet 14, has its back side 51 attached to the adhesive layer 10, allowing the two integrated circuit chips 4, 5 to be attached to each other in a back-to-back manner. During this process, the bonding pads 52 are vertically aligned to the second support member 32b so that the bonding pads 52 can be firmly supported. Moreover, with the buffering effect provided by the insulative films 9, the first integrated circuit chip 4 can be prevented from being crashed by the downward force used to attach the second integrated circuit chip 5 to the adhesive layer 10 on the back side 41 of the first integrated circuit chip 4. The circuitry and electronic components on the front side 40 of the first integrated circuit chip 4 can thus be prevented from being damaged by the downward force.

Figure 4E:
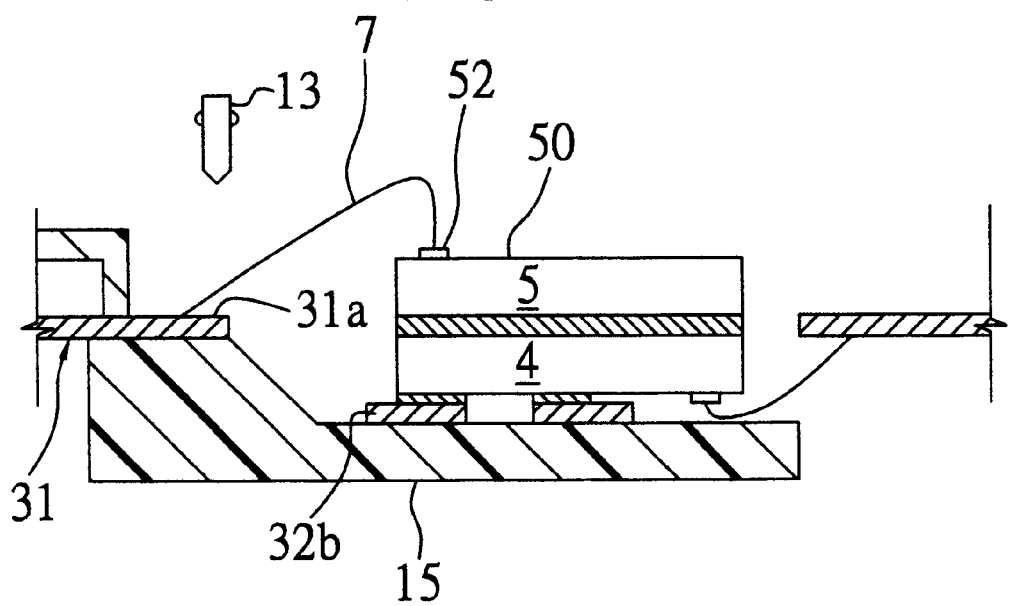

Referring next to FIG. 4E, in the subsequent step, the half-manufactured integrated circuit package assembly is placed on another heat block 15 for performing a wire-bonding process to connect a plurality of second gold wires 7 between the bonding pads 52 on the front side 50 of the second integrated circuit chip 5 and the inner parts 31a of the second leads 31. During this process, since the bonding pads 52 are firmly supported by the second support member 32b, it can prevent any of the two integrated circuit chips 4, 5 from being crashed and also assure the quality of the wire bonding.

Figure 4F:
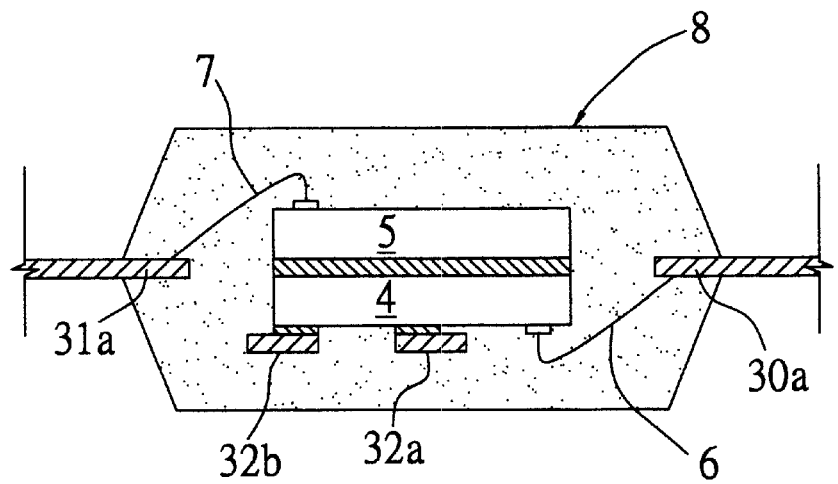

Referring further to FIG. 4F, in the next step, an encapsulation process is performed on the half-manufactured integrated circuit package assembly so as to form an encapsulant 8 to encapsulate the two integrated circuit chips 4, 5, the gold wires 6, 7, the support members 32a, 32b, and the inner parts 30a, 31a of the leads 30, 31. After this, the framing part 33 and the dam bar 34 of the leadframe 3 are cut away. Details of the encapsulation process are conventional techniques, so description thereof will not be further detailed.

Figure 4G:
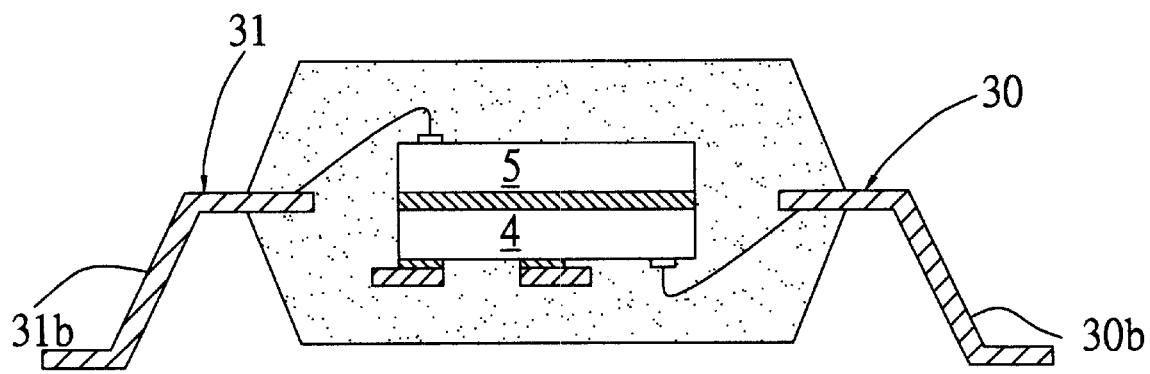

Referring next to FIG. 4G, in the final step, the outer parts 30b, 31b of the leads 30, 31 are bent into a predefined shape that allows them to be easily mounted on a circuit board (not shown). The completes the manufacture of the dual-chip integrated circuit package of the invention.

Second Preferred Embodiment

Figure 5:
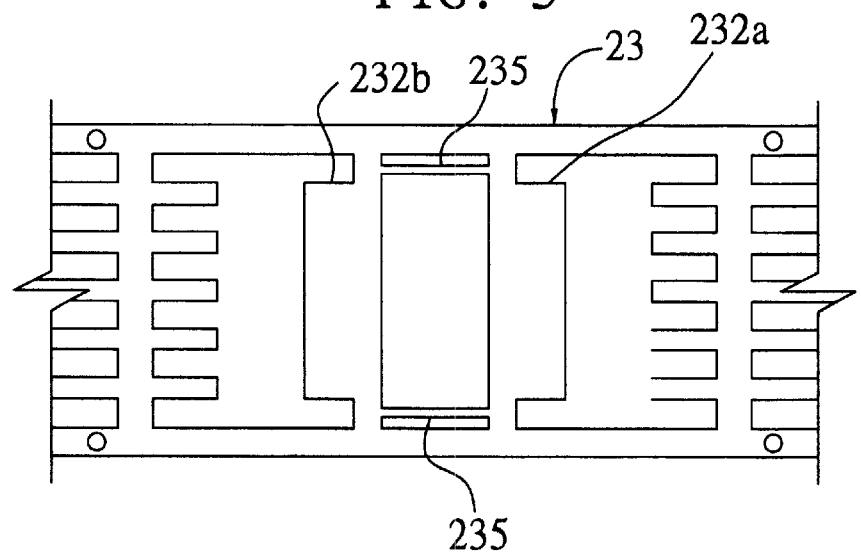
FIG. 5 shows a schematic top view of a leadframe utilized in a second preferred embodiment of the dual-chip integrated circuit package according to the invention.

FIG. 5 shows a schematic top view of a leadframe 23 utilized in a second preferred embodiment of the dual-chip integrated circuit package according to the invention.

This leadframe 23 differs from the leadframe 3 utilized in the first preferred embodiment only in that it is formed with a bridging part 235 linking the support members 232a, 232b. This allows an increased level of planarization to the support members 232a, 232b so that the mounting of the integrated circuit chip (not shown) on the support members 232a, 232b can be more reliable.

Third Preferred Embodiment

Figure 6:
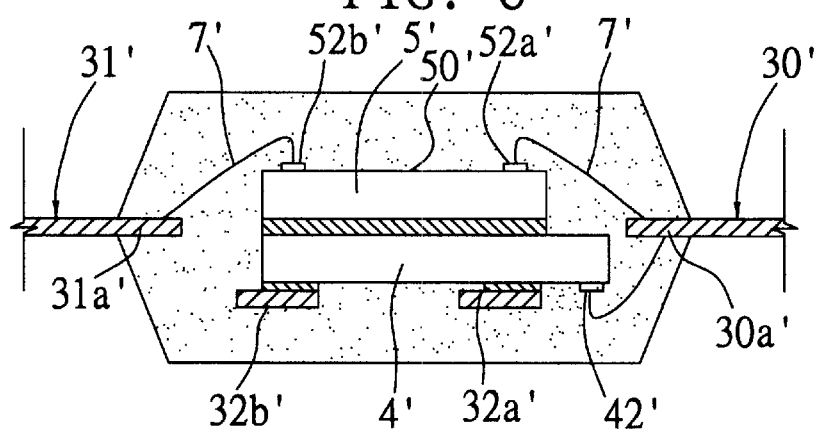
FIG. 6 is a schematic sectional diagram of a third preferred embodiment of the dual-chip integrated circuit package according to the invention.

FIG. 6 is a schematic sectional diagram of a third preferred embodiment of the dual-chip integrated circuit package according to the invention. For distinguishing purpose, the reference numerals in FIG. 6 are appended with a prime mark.

This embodiment is specifically designed for the case where the second integrated circuit chip 5' is an ASIC chip. In this case, the second integrated circuit chip 5' is formed with two rows of bonding pads 52a', 52b', which are connected via a plurality of gold wires 7' respectively to the inner parts 30a' of the first leads 30' and the inner parts 31a' of the second leads 31'. Further, the support members 32a', 32b' are respectively vertically aligned to the two rows of bonding pads 52a', 52b' so that these two rows of bonding pads 52a', 52b' can be firmly supported. Moreover, the second integrated circuit chip 5' should be smaller in dimension than the first integrated circuit chip 4' in the direction extending from the first leads 30' to the second leads 31' of the leadframe, so that the first support member 32a' can be positioned at a distance away from the bonding pads 42' on the first integrated circuit chip 4'.

Fourth Preferred Embodiment

Figure 7:
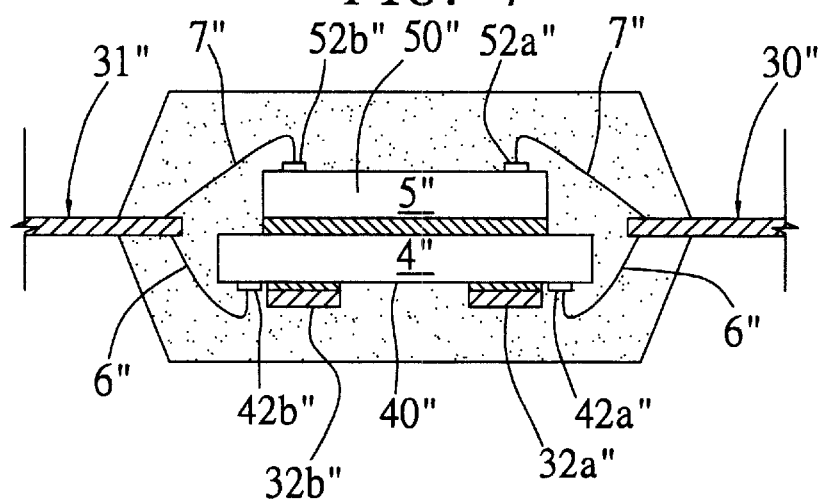
FIG. 7 is a schematic sectional diagram of a fourth preferred embodiment of the dual-chip integrated circuit package according to the invention.
Figure 8:
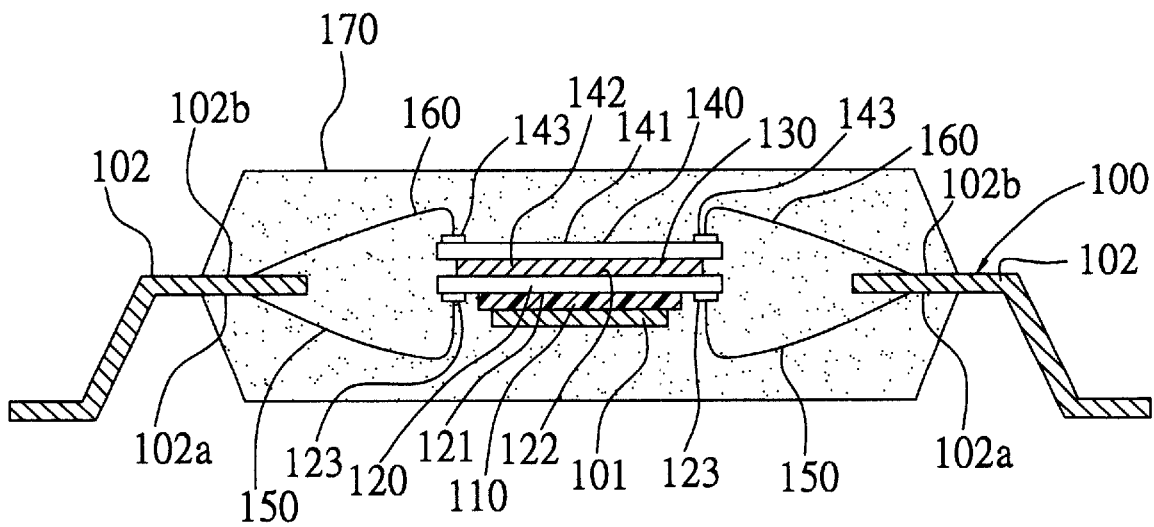
FIG. 8 (PRIOR ART) is a schematic sectional diagram of a conventional integrated circuit package.
Figure 9:
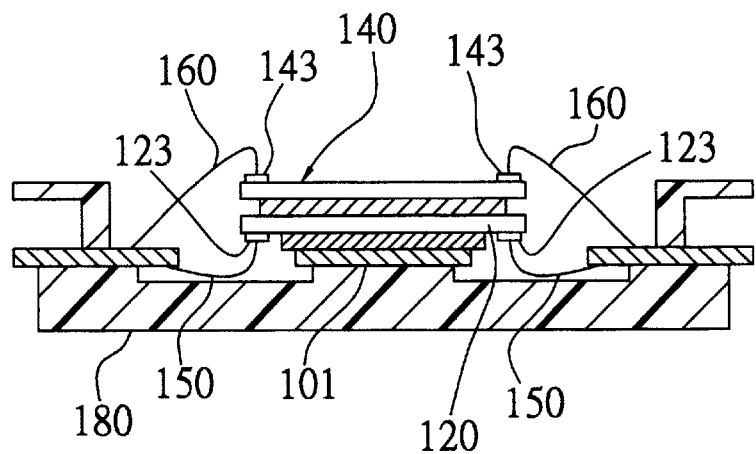
FIG. 9 (PRIOR ART) is a schematic sectional diagram used to depict the mounting of a second integrated circuit chip on the conventional integrated circuit package of FIG. 8.

FIG. 7 is a schematic sectional diagram of a fourth preferred embodiment of the dual-chip integrated circuit package according to the invention. For distinguishing purpose, the reference numerals in FIG. 7 are appended with a double-prime mark.

This embodiment is specifically designed for the case where the first integrated circuit chip 4" and the second integrated circuit chip 5" are both ASIC chips.

In this case, the first integrated circuit chip 4" is formed with two rows of bonding pads 42a", 42b", which are connected via a plurality of gold wires 6" respectively to the first leads 30" and the second leads 31"; and in a similar manner, the second integrated circuit chip 5" is formed with two rows of bonding pads 52a", 52b", which are connected via a plurality of gold wires 7" respectively to the first leads 30" and the second leads 31". In this embodiment, the support members 32a", 32b" are respectively vertically aligned to the two rows of bonding pads 52a", 52b" on the second integrated circuit chip 5" so that these two rows of bonding pads 52a", 52b" can be firmly supported by the support members 32a", 32b". Since the support members 32a", 32b" should be positioned at a distance away from the two rows of bonding pads 42a", 42b" on the first integrated circuit chip 4", the second integrated circuit chip 5" should be smaller in dimension than the first integrated circuit chip 4" in the direction extending from the first leads 30" to the second leads 31" of the leadframe.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A dual-chip integrated circuit package, which comprises:

a first integrated circuit chip having a front side and a back side, with the front side being formed with a plurality of bonding pads;

a second integrated circuit chip having a front side and a back side, with the front side being formed with a plurality of bonding pads; the second integrated circuit chip being attached to the first integrated circuit chip in a back-to-back manner;

a leadframe having a plurality of first leads and a plurality of second leads and at least a pair of support members between the first and second leads; at least one support member attached to the front side of the first integrated circuit chip for providing a support to the bonding pads on the second integrated circuit chip; the support being not smaller in dimension than the area where the bonding pads on the second integrated chip are located;

a plurality of bonding wires for connecting the bonding pads on the first integrated circuit chip to the first leads and the bonding pads on the second integrated circuit chip to the second leads;

at least one insulative adhesive for attaching the support member to the front side of the first integrated circuit chip; and an encapsulant for encapsulating the first integrated circuit chip, the second integrated circuit chip, the support members, and the inner parts of the first and second parts of the leadframe;

wherein the first integrated circuit is mounted on the support members in such a manner that the front side thereof faces the support members and the bonding pads on the first integrated circuit chip are separated from any of the support members; and the second integrated circuit chip is attached to the back side of the first integrated circuit chip and the bonding pads on the second integrated circuit chip are aligned to at least one of the support members.

2. The dual-chip integrated circuit package of claim 1, wherein the insulative adhesive is made of a resin.

3. The dual-chip integrated circuit package of claim 2, wherein the resin is polyimide.

4. The dual-chip integrated circuit package of claim 1, wherein the bonding wires are made of gold.

5. The dual-chip integrated circuit package of claim 1, wherein the leadframe is further formed with a bridging part between the two support members.

6. The dual-chip integrated circuit package of claim 1, wherein the support member is smaller in dimension than the first integrated circuit chip.

7. The dual-chip integrated circuit package of claim 1, wherein in the case of the second integrated circuit chip being formed with two rows of bonding pads, the second integrated circuit chip is smaller in dimension than the first integrated circuit chip in the direction extending from the first leads to the second leads of the lead-frame.

8. The dual-chip integrated circuit package of claim 1, wherein the first integrated circuit chip and the second integrated circuit chip are attached to each other by means of an adhesive layer.

9. The dual-chip integrated circuit package of claim 8, wherein the adhesive layer is silver paste.

10. The dual-chip integrated circuit package of claim 1, wherein only a portion of first integrated circuit chip front chip contacts the support members.

* * * * *